(12) United States Patent
Ishimaru et al.

(10) Patent No.: US 8,102,664 B2
(45) Date of Patent: Jan. 24, 2012

(54) PRINTED CIRCUIT BOARD AND METHOD OF MANUFACTURING THE SAME

(75) Inventors: Yasuto Ishimaru, Ibaraki (JP); Hirofumi Ebe, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 423 days.

(21) Appl. No.: 12/357,714

(22) Filed: Jan. 22, 2009

(65) Prior Publication Data

US 2009/0195998 A1    Aug. 6, 2009

(30) Foreign Application Priority Data

Jan. 31, 2008    (JP) .................................. 2008-021274

(51) Int. Cl.
H05K 1/18    (2006.01)
(52) U.S. Cl. ...................................................... 361/761
(58) Field of Classification Search .................. 361/760, 361/761; 257/723
See application file for complete search history.

(56) References Cited

U.S. PATENT DOCUMENTS

| 6,633,361 B1 | 10/2003 | Fujita |
| 2003/0006509 A1 | 1/2003 | Suzuki et al. |
| 2006/0274252 A1 | 12/2006 | Son |
| 2007/0013056 A1 | 1/2007 | Lee et al. |
| 2007/0108631 A1 | 5/2007 | Nakamura et al. |
| 2008/0315437 A1 | 12/2008 | Lee et al. |
| 2009/0242506 A1 | 10/2009 | Nakamura et al. |

FOREIGN PATENT DOCUMENTS

| CN | 1901179 A | 1/2007 |
| CN | 1967831 A | 5/2007 |
| EP | 1786247 A2 | 5/2007 |
| JP | 05152353 A | 6/1993 |
| JP | 2001-007460 A | 1/2001 |
| JP | 2007027682 A | 2/2007 |

OTHER PUBLICATIONS

Extended European Search Report concerning counterpart EPC application 09250027.1 dated Apr. 23, 2010.
Chinese Office Action issued Jul. 13, 2011 from the Chinese Patent Office in Chinese Application No. 200910001974.0 (with English translation).

*Primary Examiner* — Khiem Nguyen
(74) *Attorney, Agent, or Firm* — Panitch Schwarze Belisario & Nadel LLP

(57) ABSTRACT

A mounting region having a rectangular shape is provided at an approximately center of one surface of an insulating layer. A plurality of conductive traces are formed so as to outwardly extend from the inside of the mounting region. A cover insulating layer is formed so as to cover the plurality of conductive traces in a periphery of the mounting region. An electronic component is mounted on the insulating layer so as to overlap with the mounting region. A metal layer is provided on the other surface of the insulating layer. Openings having a rectangular shape are formed in the metal layer along a pair of longer sides and a pair of shorter sides of the mounting region. The openings are opposite to part of terminals of the plurality of conductive traces, respectively, with the insulating layer sandwiched therebetween.

3 Claims, 9 Drawing Sheets

F I G. 1
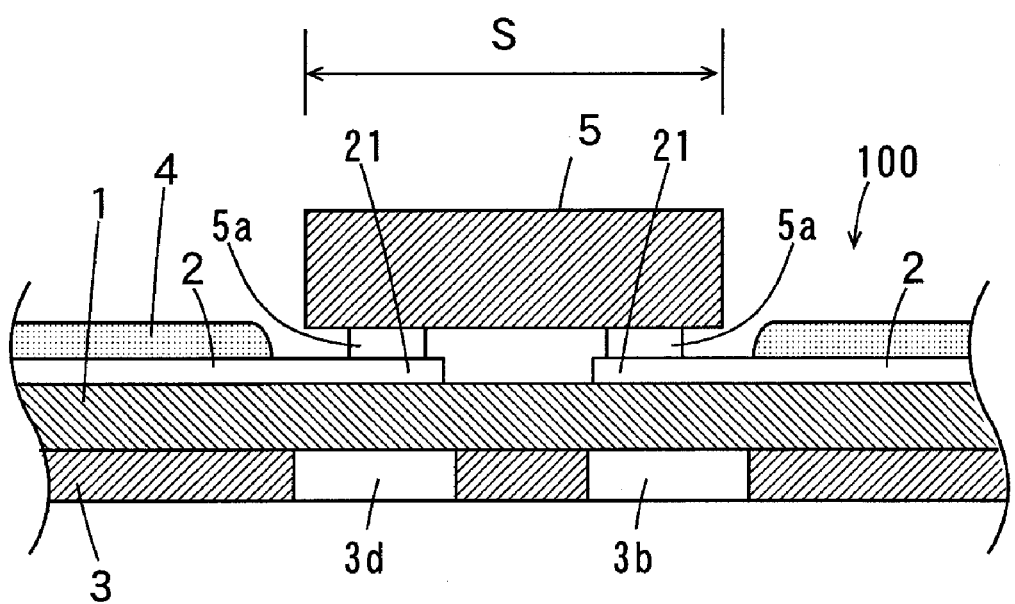

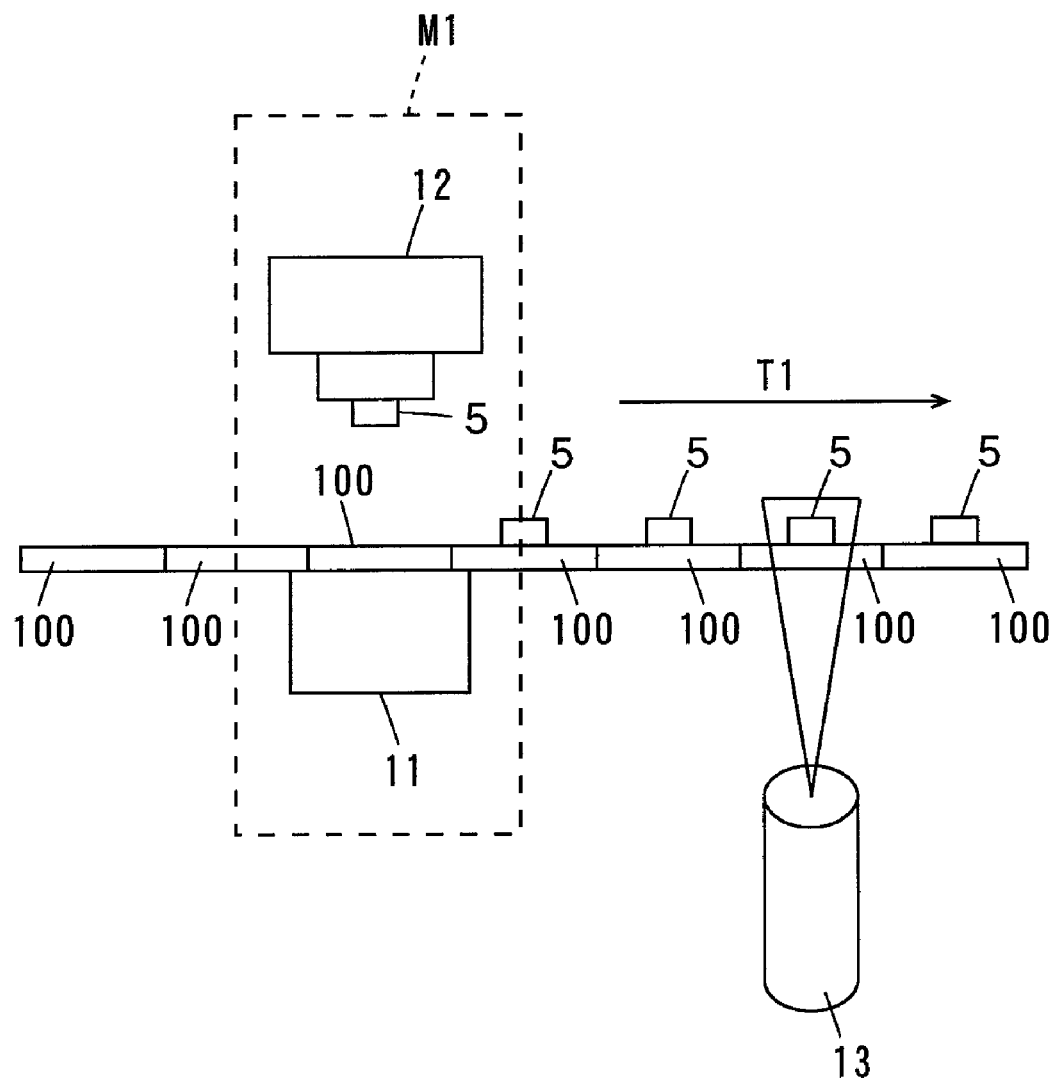
F I G. 8

PRINTED CIRCUIT BOARD AND METHOD OF MANUFACTURING THE SAME

BACKGROUND OF THE INVENTION

1. Field of the Invention

The present invention relates to a printed circuit board and a method of manufacturing the same.

2. Description of the Background Art

Conventionally, a COF (Chip On Film) mounting technique has been known as a technique for mounting electronic components such as an LSI (Large Scale Integration) on a film-like substrate. In general, the substrate for COF (hereinafter referred to as the COF substrate) has a two-layer structure of an insulating layer made of polyimide and a conductive pattern made of copper. Terminals are formed on the conductive pattern. Terminals (bumps) of the electronic components are bonded to the terminals of the conductive pattern.

With a finer pitch of the COF substrate and higher performance of the electronic components, a heating value at the time of driving increases. This causes problems such as a malfunction of the electronic components in some cases; therefore, it is important to carry out sufficient heat dissipation. Thus, it is proposed to provide a metal layer for heat dissipation on a back surface (a surface to which the electronic components are not bonded) of the COF substrate.

In a tape circuit board disclosed in JP 2007-27682 A, for example, the metal layer is formed, below a chip mounting region, on a lower surface of a base film.

FIG. 9 is a schematic sectional view of a conventional COF substrate provided with the metal layer. In the COF substrate 200 of FIG. 9, a plurality of conductive traces 32 are provided on one surface of the insulating layer 31 while the metal layer 33 is provided on the other surface. The bumps 35a of the electronic component 35 are bonded to terminals of the plurality of conductive traces 32. Such a configuration causes heat of the electronic component 35 to be dissipated through the metal layer 33.

At the time of mounting the electronic component 35, it is necessary to confirm whether or not the electronic component 35 is aligned with the plurality of conductive traces 32. When the COF substrate 200 is not provided with the metal layer 33, the electronic component 35 is seen from the other surface side of the insulating layer 31 through the insulating layer 31, so that the presence or absence of misalignment of the electronic component 35 can be confirmed. When the metal layer 33 is provided, however, it is difficult to confirm misalignment of the electronic component 35.

SUMMARY OF THE INVENTION

An object of the present invention is to provide a printed circuit board in which heat dissipation is improved while misalignment of an electronic component can be easily confirmed and a method of manufacturing the same.

(1) According to an aspect of the present invention, a printed circuit board having a mounting region on which an electronic component is to be mounted includes an insulating layer, a conductive trace that is formed on one surface of the insulating layer and has a terminal that is to be electrically connected to the electronic component, and a metal layer that is formed on the other surface of the insulating layer and has an opening, wherein the opening is formed in a region, which is opposite to the terminal of the conductive trace with the insulating layer sandwiched between the metal layer and the conductive trace, of the metal layer.

In this printed circuit board, the electronic component is connected to the terminal of the conductive trace formed on the one surface of the insulating layer. The heat of the electronic component is dissipated through the metal layer formed on the other surface of the insulating layer. This prevents generation of a malfunction of the electronic component.

The respective positions of the conductive trace and the electronic component can be visually recognized by being seen from the opening formed in the metal layer through the insulating layer at the time of connecting the electronic component with the conductive trace. This makes it possible to easily confirm whether or not the electronic component is aligned with the conductive trace. As a result, connectivity between the conductive trace and the electronic component can be improved while a mounting operation of the electronic component can be quickly and efficiently performed.

(2) The mounting region may have a rectangular shape, the conductive trace may include a plurality of first conductive traces that vertically cross one side of the mounting region to outwardly extend from an inside of the mounting region, and a plurality of second conductive traces that vertically cross another side that is vertical to the one side of the mounting region to outwardly extend from the inside of the mounting region, the terminal may include a plurality of first terminals provided at one ends of the plurality of first conductive traces inside the mounting region, and a plurality of second terminals provided at one ends of the plurality of second conductive traces inside the mounting region, and the opening may include a first opening formed in a region, which is opposite to at least one of the plurality of first terminals, of the metal layer, and a second opening formed in a region, which is opposite to at least one of the plurality of second terminals, of the metal layer.

In this case, a positional relationship between the first terminals of the first conductive traces and the electronic component is confirmed by being seen through the first opening of the metal layer, so that the presence or absence of misalignment of the electronic component in the direction parallel to the one side of the mounting region can be confirmed.

In addition, a positional relationship between the second terminals of the second conductive traces and the electronic component is confirmed by being seen through the second opening of the metal layer, so that the presence or absence of misalignment of the electronic component in the direction parallel to the another side of the mounting region can be confirmed. Furthermore, the presence or absence of inclination of the electronic component can be confirmed by the positional relationship between the first or second terminal and the electronic component.

These results allow misalignment of the electronic component to be accurately confirmed without complicating the configuration.

(3) According to another aspect of the present invention, a method of manufacturing a printed circuit board having a mounting region on which an electronic component is to be mounted includes the steps of forming on one surface of an insulating layer a conductive trace having a terminal that is to be electrically connected to the electronic component, and forming on the other surface of the insulating layer a metal layer having an opening, wherein the opening is formed in a region, which is opposite to the terminal of the conductive trace with the insulating layer sandwiched between the metal layer and the conductive trace, of the metal layer.

In this method of manufacturing the printed circuit board, the conductive trace is formed on the one surface of the insulating layer, and the metal layer is formed on the other surface of the insulating layer. In this case, heat of the electronic component connected to the conductive trace is dissipated through the metal layer. This prevents generation of a malfunction of the electronic component.

Moreover, the respective positions of the conductive trace and the electronic component can be visually recognized by being seen from the opening formed in the metal layer through the insulating layer at the time of connecting the electronic component with the conductive trace. This makes it possible to easily confirm whether or not the electronic component is aligned with the conductive trace. As a result, connectivity between the conductive trace and the electronic component can be improved while a mounting operation of the electronic component can be quickly and efficiently performed.

According to the present invention, heat of the electronic component is dissipated through the metal layer formed on the other surface of the insulating layer. This prevents generation of the malfunction of the electronic component. Moreover, the respective positions of the conductive trace and the electronic component can be visually recognized by being seen from the opening formed in the metal layer through the insulating layer. This makes it possible to easily confirm whether or not the electronic component is aligned with the conductive trace.

Other features, elements, characteristics, and advantages of the present invention will become more apparent from the following description of preferred embodiments of the present invention with reference to the attached drawings.

BRIEF DESCRIPTION OF THE DRAWINGS

FIG. 1 is a sectional view of a COF substrate according to the present embodiment.

FIG. 8 is a schematic diagram for explaining a mounting operation of the electronic component.

DESCRIPTION OF THE PREFERRED EMBODIMENTS

Figure 2:
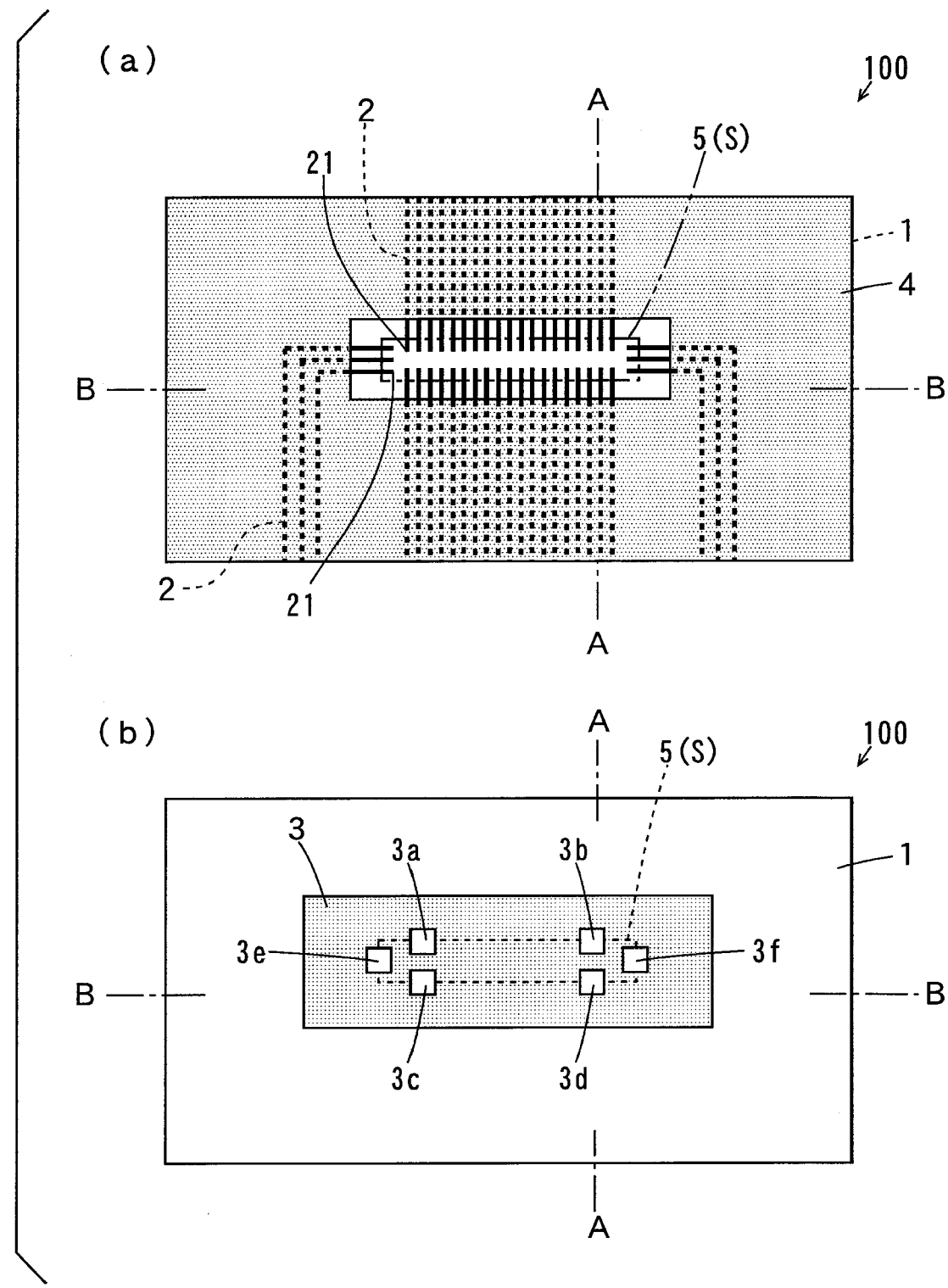
FIG. 2 is a plan view of the COF substrate according to the present embodiment.

Hereinafter, a printed circuit board and a method of manufacturing the same according to one embodiment of the present invention will be described while referring to the drawings. Note that a substrate for COF (Chip On Film) (hereinafter referred to as a COF substrate) is described as one example of the printed circuit board in the present embodiment.

(1) Configuration

FIG. 1 is a sectional view of the COF substrate according to the present embodiment, and FIG. 2 is a plan view of the COF substrate according to the present embodiment. Note that FIG. 2 (a) shows an upper surface of the COF substrate of FIG. 1, and FIG. 2 (b) shows a lower surface of the COF substrate of FIG. 1. The sectional view taken along the line A-A of FIGS. 2 (a) and (b) corresponds to the cross section of FIG. 1.

As shown in FIGS. 1 and 2, the COF substrate 100 includes an insulating layer 1 made of polyimide, for example. A mounting region S having a rectangular shape is provided at an approximately center of one surface of the insulating layer 1. A plurality of conductive traces 2 are formed so as to outwardly extend from inside of the mounting region S.

Terminals 21 are provided at respective tips of the conductive traces 2. The plurality of terminals 21 are arranged inside the mounting region S so as to be along a pair of longer sides and a pair of shorter sides of the mounting region S. The plurality of conductive traces 2 extend to vertically cross the pair of longer sides and the pair of shorter sides of the mounting region S. Note that the plurality of conductive traces 2 include wiring traces for transmitting electric signals or electric power and dummy traces not transmitting electric signals or electric power. A cover insulating layer 4 is formed in a periphery of the mounting region S so as to cover the plurality of conductive traces 2.

An electronic component 5 (an LSI (Large Scale Integration), for example) is mounted on the insulating layer 1 so as to coincide with the mounting region S. Specifically, a plurality of bumps 5a (FIG. 1) of the electronic component 5 are bonded to the terminals 21 of the plurality of conductive traces 2. The shape of the mounting region S is set so as to be the same as the shape of the electronic component 5 in planar view. In this example, the electronic component 5 having the rectangular shape is used. The plurality of bumps 5a are provided along a pair of longer sides and a pair of shorter sides of the electronic component 5 so as to correspond to the plurality of terminals 21.

As shown in FIG. 2 (b), a metal layer 3 made of copper, for example, is provided on the other surface of the insulating layer 1. In this case, heat generated in the electronic component 5 is transmitted to the metal layer 3 through the insulating layer 1 to be dissipated. Since the heat does not stay in the electronic component 5 and its periphery, generation of a malfunction of the electronic component 5 is prevented.

In the metal layer 3, rectangular openings 3a to 3f are formed along the pair of longer sides and the pair of shorter sides of the mounting region S. In this example, the openings 3a, 3b are formed along one longer side of the mounting region S, while the openings 3c, 3d are formed along the other longer side of the mounting region S. The opening 3e is formed along one shorter side of the mounting region S, and the opening 3f is formed along the other shorter side. The openings 3a to 3f are opposite to part of the terminals 21 of the plurality of conductive traces 2, respectively, with the insulating layer 1 sandwiched therebetween.

(2) The Openings

In the COF substrate 100 of the present embodiment, the presence or absence of misalignment of the electronic component 5 can be confirmed by being seen through the openings 3a to 3f formed in the metal layer 3. The details will be described while referring to FIGS. 3 and 4.

Figure 3:
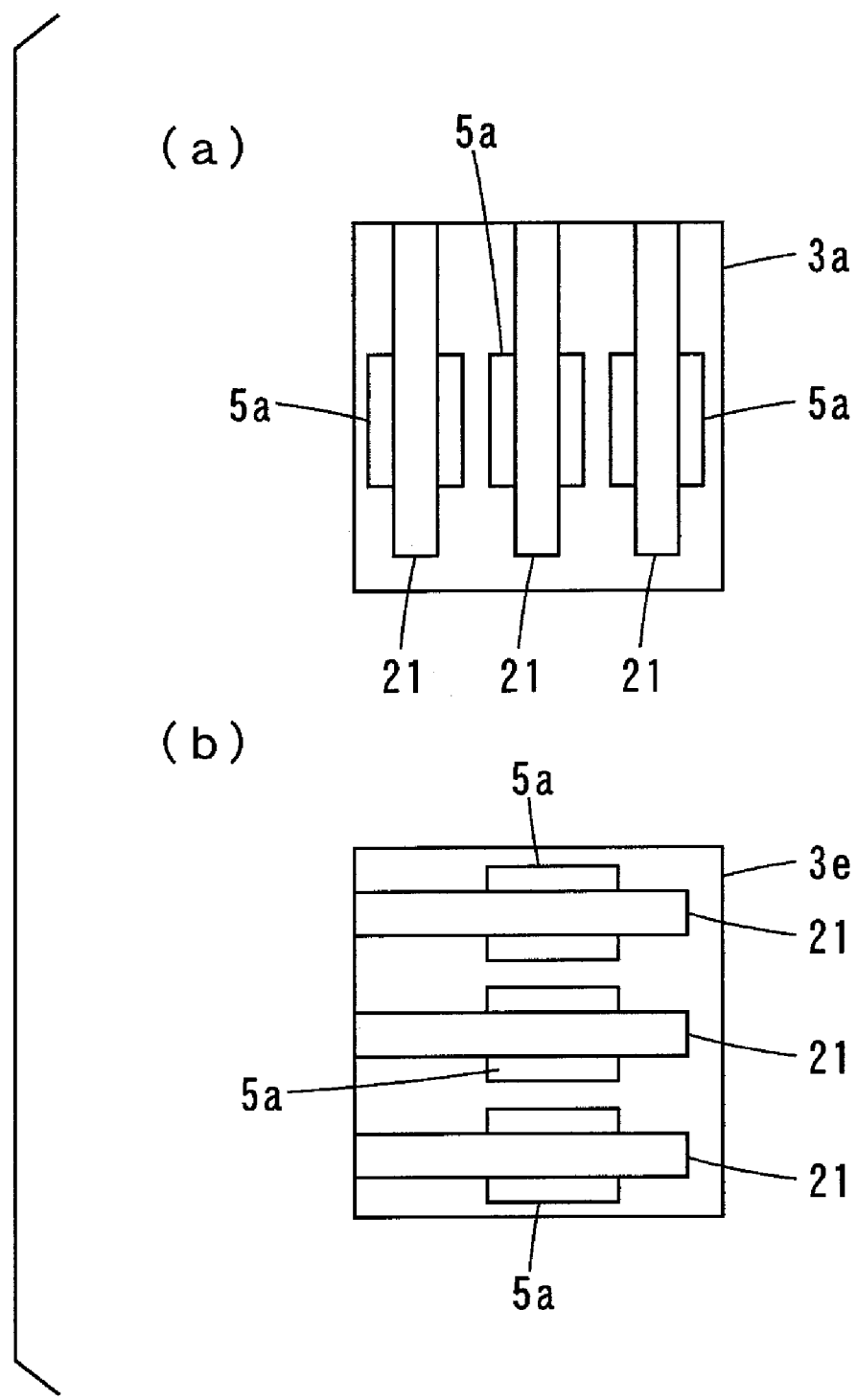
FIG. 3 is a diagram showing terminals of conductive traces and bumps of an electronic component seen through openings.

FIG. 3 (a) is a diagram showing the terminals 21 of the conductive traces 2 and the bumps 5a of the electronic component 5 seen through the opening 3a of FIG. 2 (b), and FIG. 3 (b) is a diagram showing the terminals 21 of the conductive traces 2 and the bumps 5a of the electronic component 5 seen through the opening 3e of FIG. 2 (b).

As shown in FIGS. 3 (a) and (b), the respective positions of the terminals 21 of the conductive traces 2 and the bumps 5a of the electronic component 5 can be visually recognized by being seen through the openings 3a, 3e. This makes it possible to easily and quickly confirm whether or not the bumps 5a of the electronic component 5 are accurately connected to the terminals 21 of the conductive traces 2 corresponding thereto.

Figure 4:
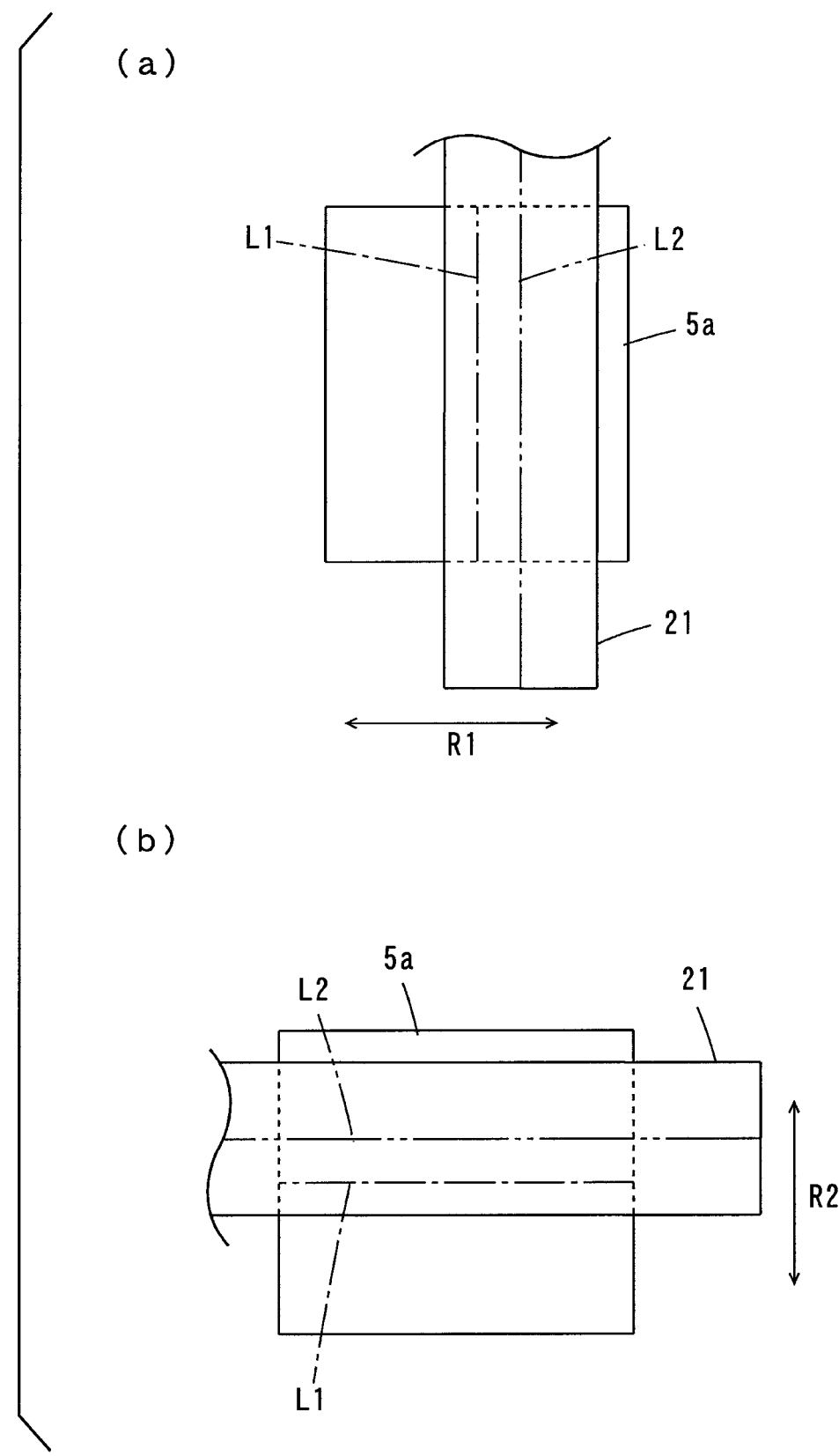
FIG. 4 is a partially enlarged view of the terminals of the conductive traces and the bumps of the electronic component seen through the openings.
Figure 5:
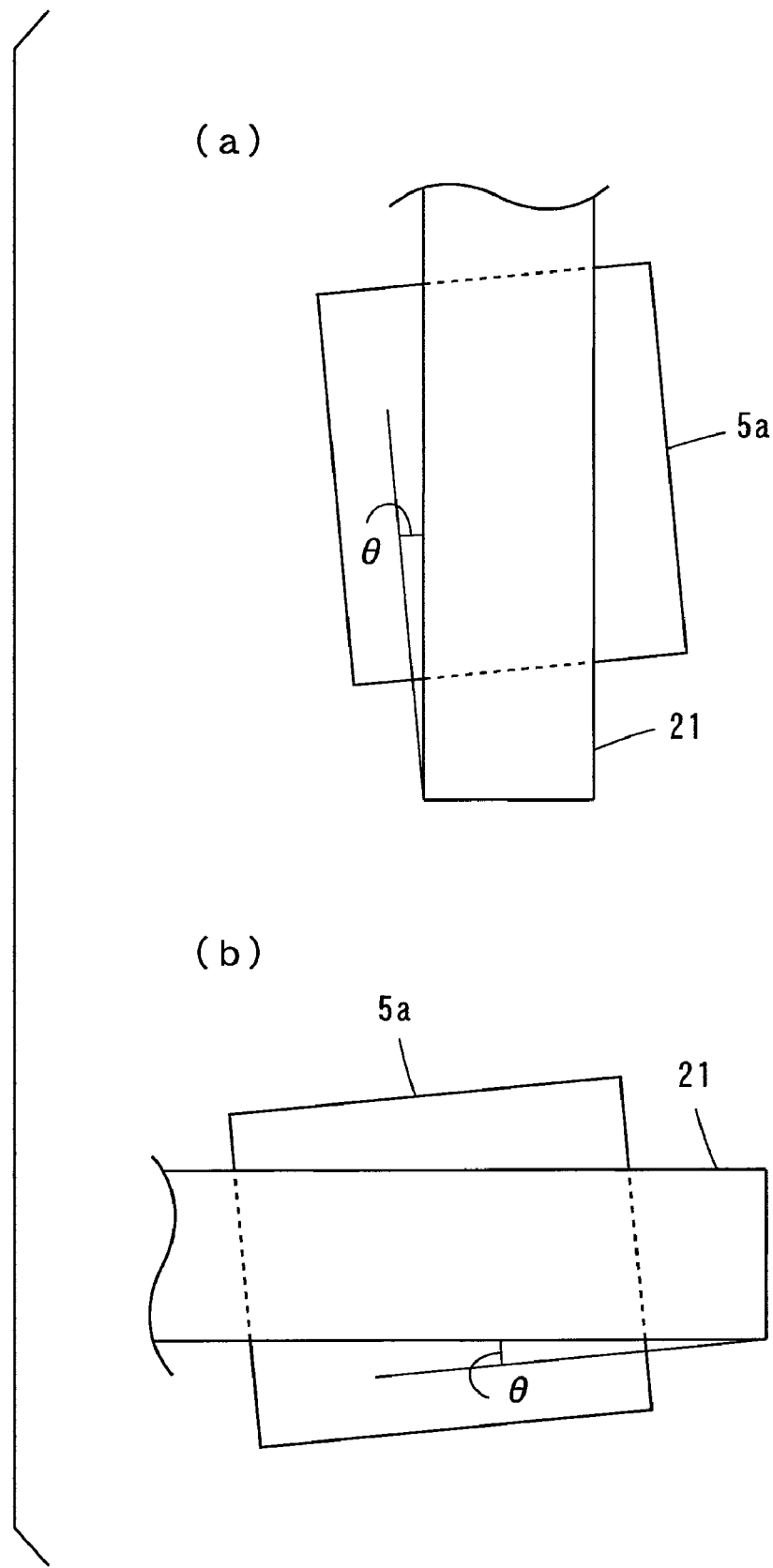
FIG. 5 is a partially enlarged view of the terminals of the conductive traces and the bumps of the electronic component seen through the openings.

Next, a method of confirming misalignment of the electronic component 5 will more specifically be described while referring to FIGS. 4 and 5. Part of the terminals 21 of the conductive traces 2 and part of the bumps 5a of the electronic component 5 seen through the opening 3a are enlarged to be shown in FIG. 4 (a) and FIG. 5 (a), and part of the terminals 21 of the conductive traces 2 and part of the bumps 5a of the electronic component 5 seen through the opening 3e are enlarged to be shown in FIG. 4 (b) and FIG. 5 (b).

As shown in FIG. 4 (a), misalignment of the electronic component 5 in a transverse direction (the direction R1 in the diagram) can be confirmed by determining whether or not the center line L1 of the bump 5a and the center line L2 of the terminal 21 coincide with each other when they are seen through the opening 3a. When the center line L1 of the bump 5a and the center line L2 of the terminal 21 coincide with each other when seen through the opening 3a, there is no misalignment of the electronic component 5 in the transverse direction.

As shown in FIG. 4 (b), misalignment of the electronic component 5 in a longitudinal direction (the direction R2 in the diagram) can be confirmed by determining whether or not the center line L1 of the bump 5a and the center line L2 of the terminal 21 coincide with each other when seen through the opening 3e. When the center line L1 of the bump 5a and the center line L2 of the terminal 21 coincide with each other when seen through the opening 3e, there is no misalignment of the electronic component 5 in the longitudinal direction.

As shown in FIGS. 5 (a) and (b), misalignment of the electronic component 5 in a direction of rotation can be confirmed by determining whether or not one side of the bump 5a and one side of the terminal 21 are parallel to each other. When the one side of the bump 5a and the one side of the terminal 21 are parallel to each other (when the angle θ in FIGS. 5 (a) and (b) is zero), there is no misalignment of the electronic component 5 in the direction of rotation.

When there is no misalignment of the electronic component 5 in any of the transverse direction, the longitudinal direction and the direction of rotation, the electronic component 5 is accurately mounted on the COF substrate 100. On the other hand, when there is misalignment of the electronic component 5 in any of the longitudinal direction, the transverse direction and the direction of rotation, the electronic component 5 is misaligned.

While the openings 3a to 3d are provided along the pair of longer sides of the mounting region S and the openings 3e, 3f are provided along the pair of shorter sides in the example of FIG. 2 (b), one opening may be provided along either one of the pair of longer sides of the mounting region S and one opening may be provided along either one of the pair of shorter sides of the mounting region S if it is possible to confirm misalignment of the electronic component 5 in the longitudinal direction, the transverse direction and the direction of rotation. For example, only one of the openings 3a to 3d may be provided and only one of the openings 3e, 3f may be provided.

Note that it is preferable that at least two openings are symmetrically provided with respect to the center of the mounting region S along one longer side and the other longer side of the mounting region S and at least one opening is provided along either one of the pair of shorter sides of the mounting region S in order to accurately confirm misalignment of the electronic component 5 in the longitudinal direction, the transverse direction and the direction of rotation. For example, the openings 3a, 3d or the openings 3b, 3c of the openings 3a to 3d are provided, and either one of the openings 3e, 3f is provided.

The shape of the openings 3a to 3f is not limited to a rectangular shape. For example, another shape such as a triangular shape or a round shape may be employed. The size of the openings 3a to 3f may be arbitrarily set. For example, the opening having a shape of a slit may be provided along the longer side or the shorter side of the mounting region S.

The shape, arrangement and the like of the openings of the metal layer 3 may suitably be changed depending on the arrangement and the like of the conductive traces 2.

(3) Manufacturing Method

Figure 6:
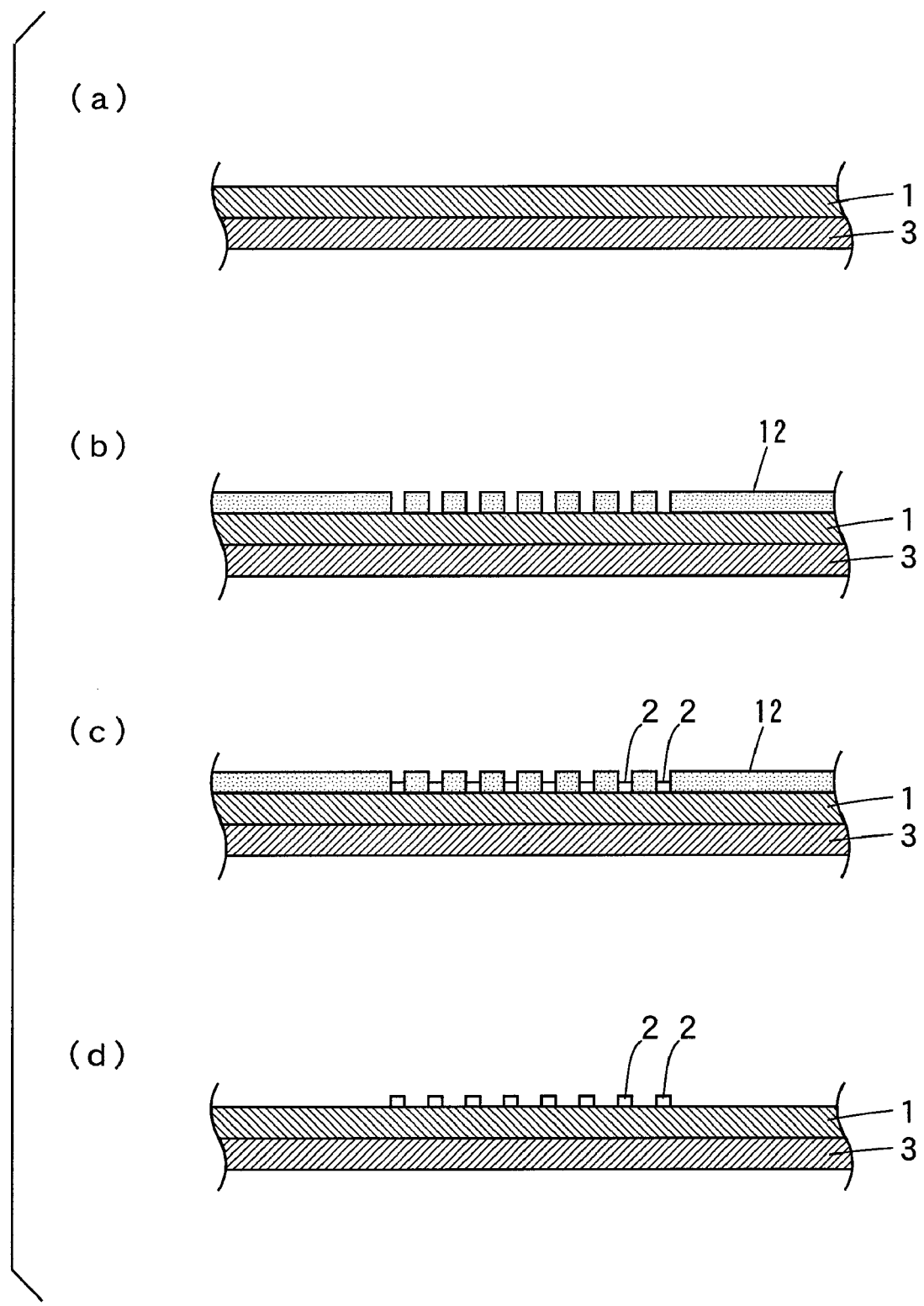
FIG. 6 is a sectional view for explaining steps in a method of manufacturing the COF substrate according to the present embodiment.
Figure 7:
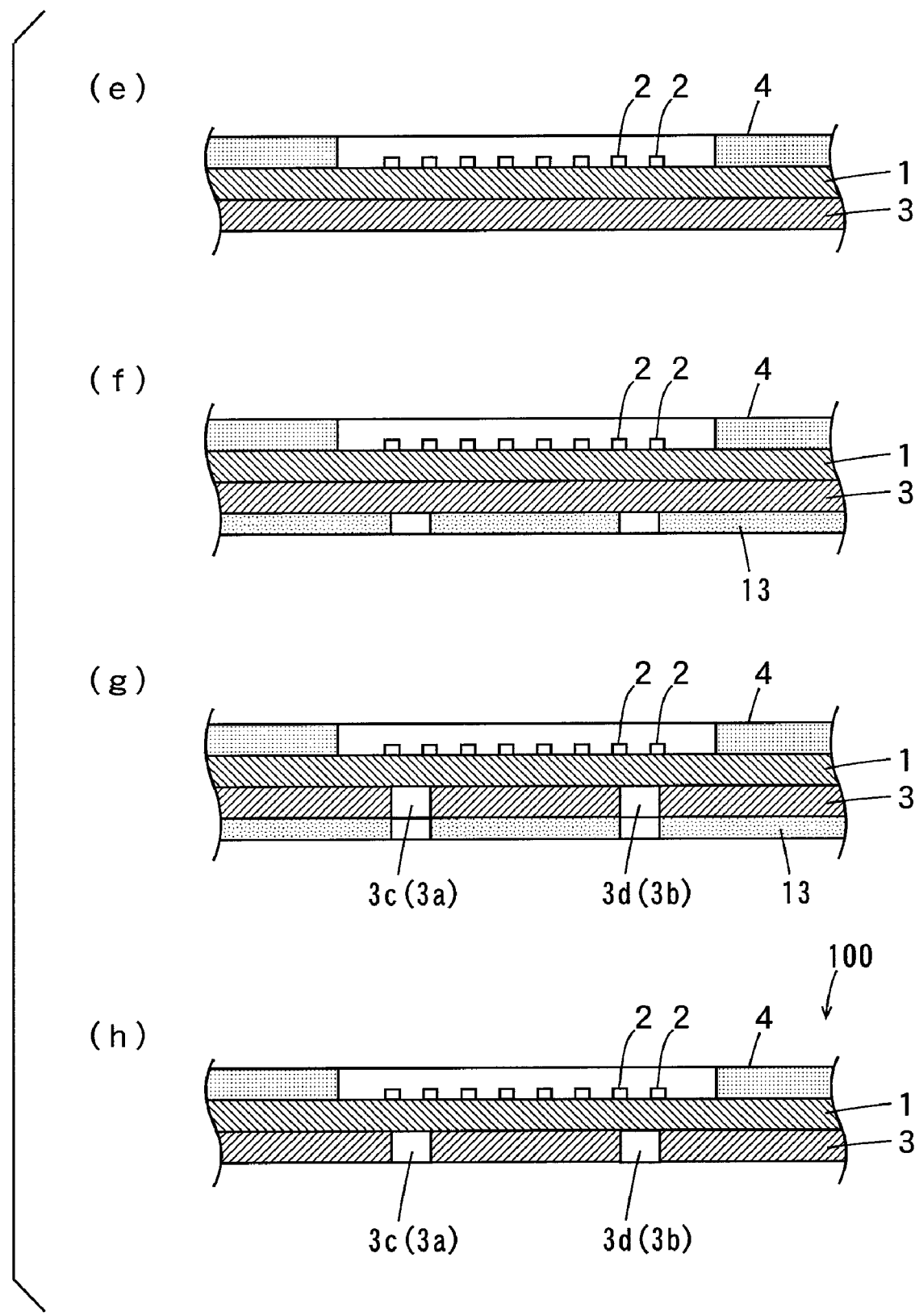
FIG. 7 is a sectional view for explaining steps in the method of manufacturing the COF substrate according to the present embodiment.
Figure 9:
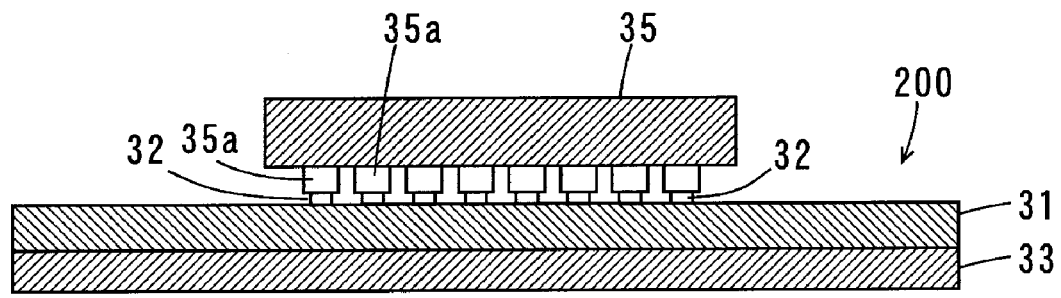
FIG. 9 is a schematic sectional view of a conventional COF substrate provided with the metal layer.

Next, description is made of one example of the method of manufacturing the COF substrate 100 according to the present embodiment. FIGS. 6 and 7 are sectional views for explaining steps in the method of manufacturing the COF substrate 100 according to the present embodiment. Note that the cross section shown in FIGS. 6 and 7 corresponds to the cross section taken along the line B-B of FIG. 2.

As shown in FIG. 6 (a), a two-layer base material composed of polyimide and copper is prepared. This two-layer base material corresponds to the insulating layer 1 and the metal layer 3 of the COF substrate 100.

First, a thin metal film (not shown) is formed by sputtering on an upper surface of the insulating layer 1. Then, a dry film resist 12 having a reverse pattern of the plurality of conductive traces 2 (FIG. 1) is formed on the thin metal film as shown in FIG. 6 (b). The reverse pattern is formed by exposure and development of the dry film resist 12.

Then, the plurality of conductive traces 2 are formed by electrolytic plating on exposed portions of the insulating layer 1 (exposed portions of the thin metal film) as shown in FIG. 6 (c). Then, the dry film resist 12 is removed by a stripping liquid while a region, under the dry film resist 12, of the thin metal film is removed by etching as shown in FIG. 6 (d).

Electroless tin plating is subsequently performed on surfaces of the conductive traces 2 as surface treatment for connection with the electronic component 5. Then, the cover insulating layer 4 is formed so as to cover a predetermined region of the conductive traces 2 as shown in FIG. 7 (e).

Next, a dry film resist 13 is formed on a lower surface of the metal layer excluding regions in which the openings 3a to 3f are to be formed, as shown in FIG. 7 (f). Then, the exposed portions of the metal layer 3 are etched to form the openings 3a to 3f as shown in FIG. 7 (g). After that, the dry film resist 13 is removed by the stripping liquid as shown in FIG. 7 (h). In this manner, the COF substrate 100 according to the present embodiment is completed.

While a semi-additive method by which the conductive traces 2 are formed is described as an example, the conductive traces 2 may be formed by a subtractive method.

(4) Inventive Example and Comparative Example (4-1) Inventive Example

The COF substrate 100 was manufactured under the following condition.

Polyimide was used as a material for the insulating layer 1, and copper was used as a material for the conductive traces 2 and the metal layer 3. The thicknesses of the insulating layer 1 and the metal layer 3 were 35 μm and 15 μm, respectively. The width of the terminal 21 of the conductive traces 2 was 8 μm, and spacing between the adjacent terminals 21 was 12 μm. In addition, the openings 3a to 3f having a square shape were formed in the metal layer 3. The length of one side of each of the openings 3a to 3f was 100 μm. The size of the bump 5a of the electronic component 5 was 13 μm×75 μm.

(4-2) Comparative Example

The COF substrate 100 was manufactured in the same manner as that of the foregoing inventive example except that the openings 3a to 3f were not formed in the metal layer 3.

(4-3) Evaluation

A mounting operation of the electronic component 5 was performed under the following condition.

FIG. 8 is a schematic diagram for explaining the mounting operation of the electronic component 5. As shown in FIG. 8, the plurality of COF substrates 100 are integrally formed so as to extend in a long-sized shape, and transported along the direction T1. In a mounting part M1, one COF substrate 100 is placed on a stage 11. In the state, a tool 12 mounts the electronic component 5 on the COF substrate 100 on the stage 11 by thermocompression bonding. Note that at the time of mounting, the temperature of the tool 12 was 430° C., the temperature of the stage 11 was 100° C., and a mounting load was 30 N.

After the electronic component 5 was mounted, the COF substrate 100 was observed from the side of the metal layer 3 (the lower surface side) using a CCD camera 13.

As a result, misalignment of the electronic component 5 was easily confirmed by being seen through the openings 3a to 3f in the metal layer 3 in the inventive example. Therefore, the mounting operation of the electronic component 5 was efficiently and quickly performed. On the other hand, it was difficult to confirm misalignment of the electronic component 5 in the comparative example. This significantly reduced an efficiency of the mounting operation of the electronic component 5.

(5) Correspondences Between Elements in the Claims and Parts in Embodiments

In the following paragraph, non-limiting examples of correspondences between various elements recited in the claims below and those described above with respect to various preferred embodiments of the present invention are explained.

In the above-described embodiment, the COF substrate 100 is an example of a printed circuit board, the longer side of the mounting region is an example of one side of a mounting region, and the shorter side of the mounting region is an example of the other side of the mounting region. The conductive traces 2 that cross the longer sides of the mounting region are examples of a first conductive trace, the terminals 21 arranged along the longer sides of the mounting region are examples of a first terminal, the conductive traces 2 that cross the shorter sides of the mounting region are examples of a second conductive trace, and the terminals 21 arranged along the shorter sides of the mounting region are examples of a second terminal. The openings 3a to 3f are examples of a first opening, and the openings 3e, 3f are examples of a second opening.

As each of various elements recited in the claims, various other elements having configurations or functions described in the claims can be also used.

(6) Other Embodiments

The material for the insulating layer 1 is not limited to polyimide. For example, another insulating material such as polyethylene terephthalate, polyethernitrile, polyethersulfone may be used. Moreover, the material for the conductive traces 2 is not limited to copper. For example, another metal material such as copper alloy, gold, aluminum may be used.

The material for the metal layer 3 is not limited to copper. For example, metal having high thermal conductivity such as copper, gold, silver or aluminum is preferably used.

The present invention is applicable to various printed circuit boards such as a flexible printed circuit board and a rigid printed circuit board. Moreover, the electronic component 5 is not limited to an LSI. For example, another electronic component such as a capacitor may be used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A printed circuit board having a mounting region on which an electronic component is to be mounted, comprising:
   an insulating layer;
   a plurality of conductive traces that are formed on one surface of said insulating layer, each conductive trace having a terminal that is to be electrically connected to said electronic component; and
   a metal layer that is formed on the other surface of said insulating layer,
      wherein each terminal is provided in said mounting region along an outer periphery of said mounting region, and
      wherein a plurality of openings are formed in said metal layer along the outer periphery of said mounting region, each of the openings being arranged so as to coincide with at least one of the terminals of the plurality of conductive traces, no opening formed in the metal layer being arranged to coincide with a remainder of the conductive traces.

2. The printed circuit board according to claim 1, wherein said mounting region has a rectangular shape,
   said plurality of conductive traces include a plurality of first conductive traces that perpendicularly cross a first side of said mounting region to outwardly extend from an inside of said mounting region, and a plurality of second conductive traces that perpendicularly cross a second side of said mounting region that is perpendicular to said first side to outwardly extend from the inside of said mounting region,
   said terminals include a plurality of first terminals provided at one end of said plurality of first conductive traces inside said mounting region, and a plurality of second terminals provided at one end of said plurality of second conductive traces inside said mounting region, and
   said plurality of openings include a first opening that is arranged so as to coincide with at least one of said plurality of first terminals, and a second opening that is arranged so as to coincide with at least one of said plurality of second terminals.

3. A method of manufacturing a printed circuit board having a mounting region on which an electronic component is to be mounted; comprising the steps of:
   forming on one surface of an insulating layer a plurality of conductive traces, each conductive trace having a terminal that is to be electrically connected to said electronic component; and
   forming on the other surface of said insulating layer a metal layer having a plurality of openings, wherein each terminal is provided in said mounting region along an outer periphery of said mounting region, and wherein the plurality of openings are formed in said metal layer along the outer periphery of said mounting region, each of the openings being arranged so as to coincide with at least one of the terminals of the plurality of conductive traces, no opening formed in the metal layer being arranged to coincide with a remainder of the conductive traces.

* * * * *